US012763293B2

(12) United States Patent
Hayasaka et al.

(10) Patent No.: US 12,763,293 B2
(45) Date of Patent: Oct. 13, 2026

(54) SUBSTRATE SUPPORT, PLASMA PROCESSING SYSTEM, AND PLASMA ETCHING METHOD

(71) Applicant: Tokyo Electron Limited, Tokyo (JP)

(72) Inventors: Naoto Hayasaka, Miyagi (JP); Tomoyuki Takahashi, Miyagi (JP); Yuki Kawada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 279 days.

(21) Appl. No.: 17/668,429

(22) Filed: Feb. 10, 2022

(65) Prior Publication Data

US 2022/0270862 A1 Aug. 25, 2022

(30) Foreign Application Priority Data

Feb. 10, 2021 (JP) ................................ 2021-019669

(51) Int. Cl.
*H01L 21/306* (2006.01)
*H01J 37/32* (2006.01)
(Continued)

(52) U.S. Cl.
CPC .. *H01J 37/32642* (2013.01); *H01J 37/32091* (2013.01); *H01J 37/3244* (2013.01);
(Continued)

(58) Field of Classification Search
CPC .......... H01J 37/32091; H01J 37/32715; H01J 37/32642; H01J 37/32623; H10P 72/76;
(Continued)

(56) References Cited

U.S. PATENT DOCUMENTS 6,363,882 B1 * 4/2002 Hao .................. H01J 37/32623 118/723 E
2003/0201069 A1 * 10/2003 Johnson ............ H01J 37/32082 156/345.43
(Continued)

FOREIGN PATENT DOCUMENTS

CN 108369922 A 8/2018
CN 112309819 A 2/2021
(Continued)

*Primary Examiner* — Luz L Alejandro Mulero
(74) *Attorney, Agent, or Firm* — XSENSUS LLP

(57) ABSTRACT

There is a substrate support for use in a plasma processing apparatus, the substrate support comprising: a base; a ceramic plate disposed on the base, the ceramic plate having a substrate supporting region and a ring supporting region surrounding the substrate supporting region; an insulating annular member disposed around the base and the ceramic plate; a fixed edge ring having an inner portion and an outer portion, the inner portion being supported on the ring supporting region, the outer portion being supported on the insulating annular member, the outer portion having a first width; a movable edge ring disposed above the outer portion of the fixed edge ring, the movable edge ring having a second width smaller than the first width; and an actuator configured to vertically move the movable edge ring with respect to the fixed edge ring.

16 Claims, 5 Drawing Sheets

(51) Int. Cl.

| | |
|---|---|
| ***H10P 50/24*** | (2026.01) |
| ***H10P 72/72*** | (2026.01) |
| ***H10P 72/76*** | (2026.01) |

(52) U.S. Cl.

CPC .. *H01J 37/32623* (2013.01); *H01J 37/32715* (2013.01); *H10P 50/242* (2026.01); *H10P 72/722* (2026.01); *H10P 72/7606* (2026.01); *H10P 72/7611* (2026.01); *H10P 72/7612* (2026.01); *H01J 2237/334* (2013.01)

(58) Field of Classification Search

CPC ............. H10P 72/7606; H10P 72/7612; H01L 21/68742; H01L 21/68735

See application file for complete search history.

(56) References Cited

U.S. PATENT DOCUMENTS

| | | | | |
|---|---|---|---|---|
| 2004/0184792 | A1* | 9/2004 | Hamelin | H01L 21/67069<br>219/390 |
| 2012/0175063 | A1* | 7/2012 | Yamawaku | H01L 21/67069<br>156/345.46 |
| 2013/0048217 | A1* | 2/2013 | Shiraiwa | H01J 37/32788<br>361/234 |
| 2017/0213758 | A1* | 7/2017 | Rice | H01J 37/32082 |
| 2018/0218933 | A1* | 8/2018 | Luere | H01L 21/68742 |
| 2019/0326104 | A1* | 10/2019 | Asako | H01J 37/32724 |
| 2020/0020565 | A1* | 1/2020 | Rathnasinghe | H01J 37/32807 |
| 2021/0035783 | A1* | 2/2021 | Taira | H01J 37/32642 |
| 2021/0098238 | A1* | 4/2021 | Hayashi | H01L 21/68735 |

FOREIGN PATENT DOCUMENTS

| | | | |
|---|---|---|---|
| JP | 2012146743 | A | 8/2012 |
| JP | 2015-109249 | A | 6/2015 |

* cited by examiner

SUBSTRATE SUPPORT, PLASMA PROCESSING SYSTEM, AND PLASMA ETCHING METHOD

CROSS-REFERENCE TO RELATED APPLICATION

This application claims priority to Japanese Patent Application No. 2021-019669 filed on Feb. 10, 2021, the entire contents of which are incorporated herein by reference.

TECHNICAL FIELD

The present disclosure relates to a substrate support, a plasma processing system and a plasma etching method.

BACKGROUND

Japanese Laid-open Patent Publication No. 2015-109249 discloses a plasma processing apparatus for exciting a processing gas by microwaves. The plasma processing apparatus includes a processing chamber, a substrate support disposed in the processing chamber and having a lower electrode and an electrostatic chuck disposed on the lower electrode, and a focus ring made of a dielectric material and extending in an annular shape to surround the electrostatic chuck.

SUMMARY

The technique of the present disclosure appropriately controls plasma distribution on a substrate during plasma processing.

In accordance with an aspect of the present disclosure, there is a substrate support for use in a plasma processing apparatus, the substrate support comprising: a base; a ceramic plate disposed on the base, the ceramic plate having a substrate supporting region and a ring supporting region surrounding the substrate supporting region; an insulating annular member disposed around the base and the ceramic plate; a fixed edge ring having an inner portion and an outer portion, the inner portion being supported on the ring supporting region, the outer portion being supported on the insulating annular member, the outer portion having a first width; a movable edge ring disposed above the outer portion of the fixed edge ring, the movable edge ring having a second width smaller than the first width; and an actuator configured to vertically move the movable edge ring with respect to the fixed edge ring.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
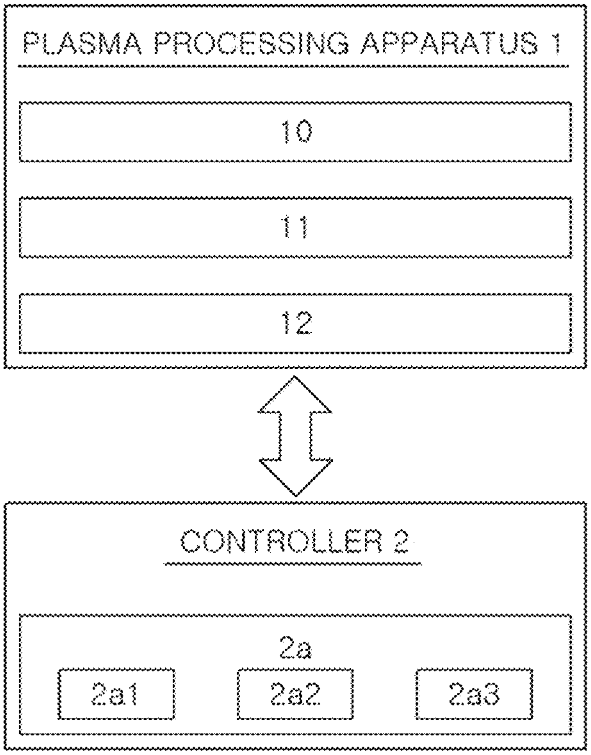
FIG. 1 illustrates a schematic configuration of a plasma processing system.

In a semiconductor device manufacturing process, plasma processing such as etching, film formation, or the like is performed on a semiconductor substrate (hereinafter, referred to as "substrate"). In plasma processing, the substrate is processed by plasma that is generated by exciting a processing gas.

There are various methods for exciting a processing gas. For example, as disclosed in Japanese Laid-open Patent Publication No. 2015-109249, a plasma processing apparatus for exciting a processing gas by microwaves is used. In this plasma processing apparatus, a focus ring is disposed around the substrate support. The focus ring adjusts a sheath potential outside an edge of a substrate placed on the substrate support to adjust in-plane uniformity of plasma processing on the substrate.

However, the focus ring is not enough to ensure uniformity of plasma distribution. Therefore, conventionally, the plasma distribution is controlled by adjusting plasma processing conditions. However, if the plasma processing conditions are adjusted, the restriction in the plasma processing increases and, thus, a degree of freedom decreases. Further, the conventional plasma processing apparatus does not include a plasma distribution control knob (control member). Therefore, the conventional plasma processing needs to be improved.

The technique of the present disclosure appropriately controls plasma distribution on a substrate during plasma processing. Hereinafter, a substrate support, a plasma processing system, and a plasma etching method according to embodiments will be described with reference to the drawings. Like reference numerals will be given to like parts having substantially the same functions throughout this specification and the drawings, and redundant description thereof will be omitted.

<Configuration of Plasma Processing System>

First, the plasma processing system according to an embodiment will be described. FIG. 1 explains a schematic configuration of a plasma processing system.

In one embodiment, as shown in FIG. 1, the plasma processing system includes a plasma processing apparatus 1 and a controller 2. The plasma processing apparatus 1 includes a plasma processing chamber 10, a substrate support 11, and a plasma generator 12. The plasma processing chamber 10 has a plasma processing space. Further, the plasma processing chamber 10 has at least one gas inlet for supplying at least one processing gas to the plasma processing space, and at least one gas outlet tor exhausting gases from the plasma processing space. The gas inlet is connected to a gas supply 30 to be described later, and the gas outlet is connected to an exhaust system 50 to be described later. The substrate support 11 is disposed in the plasma processing space and has a substrate support surface for supporting the substrate.

The plasma generator 12 is configured to generate a plasma from at least one processing gas supplied into the plasma processing space. The plasma generated in the plasma processing space may be capacitively coupled plasma (CCP), inductively coupled plasma (ICP), electron-cyclotron-resonance (ECR) plasma, helicon wave plasma (HWP), surface wave plasma (SWP), or the like. Further, various types of plasma generators including an alternating current (AC) plasma generator and a direct current (DC) plasma generator may be used. In one embodiment, an AC signal (AC power) used in the AC plasma generator has a frequency within a range of 100 kHz to 10 GHz. Therefore, the AC signal includes a radio frequency (RF) signal and a microwave signal. In one embodiment, the RF signal has a frequency within a range of 200 kHz to 150 MHz.

The controller 2 processes computer-executable instructions that cause the plasma processing apparatus 1 to perform various steps described in the present disclosure. The controller 2 may be configured to control individual components of the plasma processing apparatus 1 to perform various steps described herein. In one embodiment, the controller 2 may be partially or entirely included in the plasma processing apparatus 1. The controller 2 may include, e.g., a computer 2*a*. The computer 2*a* may include, e.g., a central processing unit (CPU) 2*a*1, a storage device 2*a*2, and a communication interface 2*a*3. The central processing unit 2*a*1 may be configured to perform various control operations based on a program stored in the storage device 2*a*2. The storage device 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 through a communication line such as a local area network (LAN) or the like.

<Configuration of Plasma Processing Apparatus>

Figure 2:
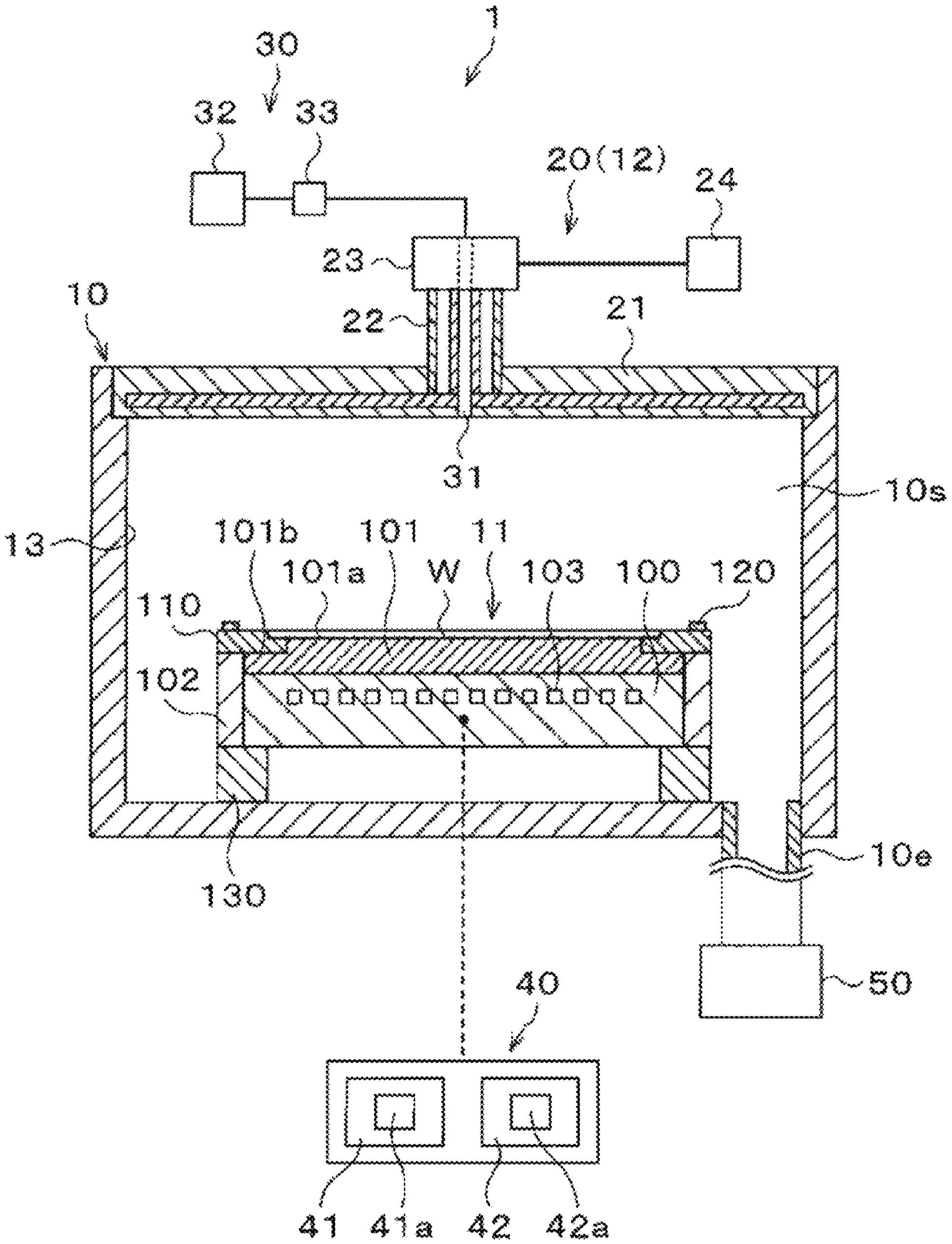
FIG. 2 is a vertical cross-sectional view showing a schematic configuration of a plasma processing apparatus.

Hereinafter, a configuration example of a plasma processing apparatus using microwaves will be described as an example of the plasma processing apparatus 1. FIG. 2 is a vertical cross-sectional view showing a schematic configuration of the plasma processing apparatus 1.

In one embodiment, as shown in FIG. 2, the plasma processing apparatus 1 includes a plasma processing chamber 10, a microwave supply 20, a gas supply 30, a power supply 40, and an exhaust system 50. Further, as described above, the plasma processing apparatus 1 includes the substrate support 11 and the plasma generator 12, and the microwave supply 20 functions as a part of the plasma generator 12, which will be described later. The substrate support 11 is disposed in the plasma processing chamber 10. The plasma processing chamber 10 has a plasma processing space 10*s* defined by a radial line slot antenna (RLSA) 21 (to be described later) of the microwave supply 20, a sidewall 13 of the plasma processing chamber 10, and the substrate support 11 (bottom portion of the plasma processing chamber 10).

The substrate support 11 supports a substrate (wafer) W. The configuration of the substrate support 11 will be described in detail later.

The microwave supply 20 includes the radial line slot antenna 21, a coaxial waveguide 22, a mode converter 23, and a microwave source 24. The radial line slot antenna 21 is disposed at an opening formed on a ceiling surface of the plasma processing chamber 10. The radial line slot antenna 21 compresses microwaves to shorten the wavelength thereof, and irradiates circularly polarized microwaves into the plasma processing space 10*s*. The coaxial waveguide 22 is connected to a central portion of the radial line slot antenna 21. Further, the mode converter 23 is connected to an upper end of the coaxial waveguide 22, and the microwave source 24 is further connected to the mode converter 23. The mode converter 23 converts the microwaves into a desired vibration mode. The microwave source 24 is disposed outside the plasma processing chamber 10, and may generate microwaves of 2.45 GHz, for example.

In one embodiment, the microwaves generated from the microwave source 24 sequentially propagate through the mode converter 23 and the coaxial waveguide 22, and then are irradiated from the radial line slot antenna 21 to the plasma processing space 10*s*. Due to the microwaves, plasma is generated from at least one processing gas supplied into the plasma processing space 10*s*. Therefore, the microwave supply 20 can function as at least a part of the plasma generator 12.

The gas supply 30 includes a gas supply line 31, at least, one gas source 32, and at least one flow rate controller 33. The gas supply line 31 penetrates through the central portion of the radial line slot antenna 21, and one end of the gas supply line 31 is opened at the central portion of the bottom surface of the radial line slot antenna 21. Further, the gas supply line 31 penetrates through the coaxial waveguide 22 and the mode converter 23, and the other end of the gas supply line 31 is connected to at least one gas source 32. The flow rate controller 33 may include, e.g., a mass flow controller or a pressure-control type flow rate controller. Further, the gas supply 30 may include at least one flow rate modulation device for modulating the flow rate of at least one processing gas or causing it to pulsate. In one embodiment, at least one processing gas is supplied from the corresponding gas source 32 to the gas supply line 31 through the corresponding flow rate controller 33, and further introduced into the plasma processing space 10*s*. At least one processing gas has a gas containing, e.g., F, Cl, Br, Ar or the like.

The power supply 40 includes an RF power supply 41 connected to the plasma processing chamber 10 through at least one impedance matching circuit. The RF power supply 41 is configured to supply at least one RF signal (RF power), such as a bias RF signal, to a base 100 (to be described later) of the substrate support 11 that includes a conductive member. By supplying the bias RF signal to the base 100 of the substrate support 11, a bias potential is generated at the substrate W, and ions in the plasma can be attracted to the substrate W.

In one embodiment, the RF power supply 41 includes an RF generator 41*a*. The RF generator 41*a* is connected to the base 100 of the substrate support 11 through at least one impedance matching circuit, and is configured to generate a bias RF signal (bias RF power). In one embodiment, the bias RF signal has a frequency within a range of 400 kHz to 13.56 MHz. In one embodiment, the RF generator 41*a* may be configured to generate a plurality of bias RF signals having different frequencies. The generated single or multiple bias RF signals are supplied to the base 100 of the substrate support 11. In various embodiments, the bias RF signal may be pulsated.

Further, the power supply 40 may include a DC power supply 42 connected to the plasma processing chamber 10. The DC power supply 42 includes a bias DC generator 42*a*. In one embodiment, the bias DC generator 42*a* is connected to the base 100 of the substrate support 11 and is configured to generate a bias DC signal. The generated bias DC signal is applied to the base 100 of the substrate support 11. In one embodiment, the bias DC signal may be applied to another electrode such as an electrodes in a ceramic plate 101 (to be described later) of the substrate support 11. In various embodiments, the bias DC signal may be pulsated. The bias DC generator 42*a* may be provided in addition to the RF power supply 41, or may be provided instead of the RF power generator 41*a*.

The exhaust system 50 may be connected to a gas cutlet 10*e* disposed at the bottom portion of the plasma processing chamber 10, for example. The exhaust system 50 may include a pressure control valve and a vacuum pump. The pressure control valve adjusts the pressure in the plasma processing space 10*s*. The vacuum pump may include a turbo molecular pump, a dry pump, or a combination thereof.

<Configuration of Substrate Support>

Figure 3:
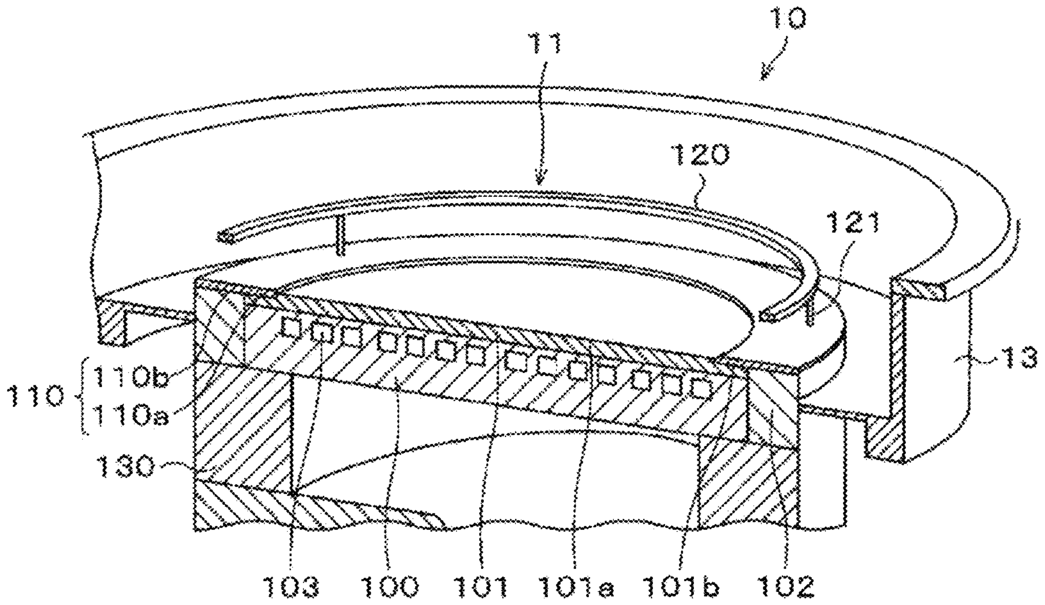
FIG. 3 is a perspective cross-sectional view showing a schematic configuration of a substrate support.
Figure 4:
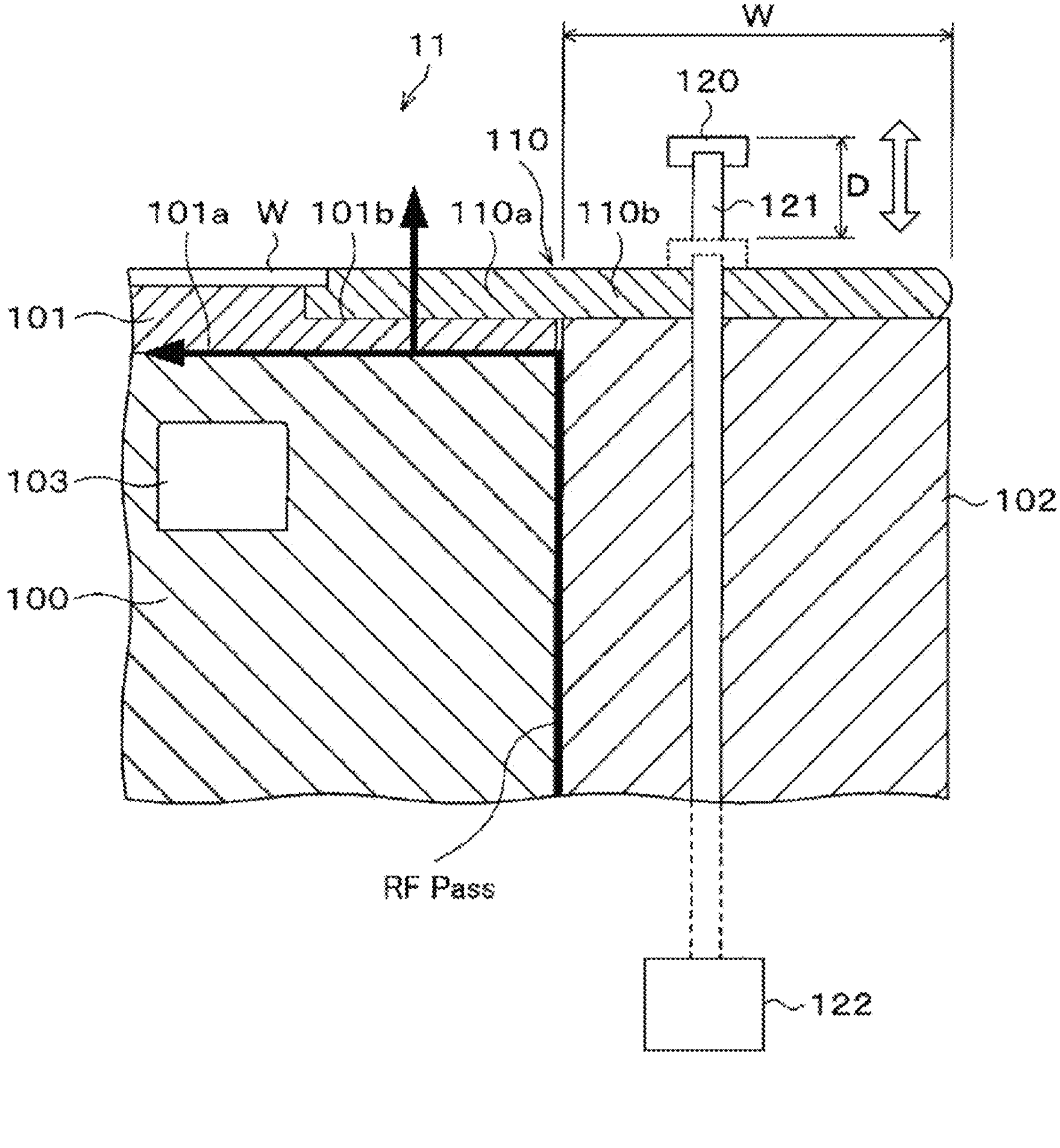
FIG. 4 is a vertical cross-sectional view showing a schematic configuration of a part of the substrate support.

Hereinafter, a configuration example of the substrate support 11 will be described. FIG. 3 is a perspective sectional view showing a schematic configuration of the substrate support 11. FIG. 4 is a vertical cross-sectional view showing a part of the schematic configuration of the substrate support 11.

In one embodiment, as shown in FIGS. 3 and 4, the substrate support 11 includes a base 100, a ceramic plate 101, an insulating annular member 102, a fixed edge ring 110, a movable edge ring 120, lifter pins 121, and a moving mechanism (actuator) 122. The substrate support 11 is fastened to a support member 130 disposed at the bottom portion of the plasma processing chamber 10.

The base 100 includes a conductive member made of a conductive metal, e.g., aluminum, or the like. The conductive member of the base 100 functions as a lower electrode. A flow path 103 is formed in the base 100. A heat transfer fluid such as brine or a gas flows through the flow path 103.

The ceramic plate 101 is disposed on the base 100. The ceramic plate 101 is configured to attract and hold both the substrate W and the fixed edge ring 110 by an electrostatic force, and functions as an electrostatic chuck. In other words, the ceramic plate 101 has a substrate supporting region (central region) 103*a* for supporting the substrate W and a ring supporting region (annular region) 101*b* for supporting the fixed edge ring 110. The ring supporting region 101*b* is disposed around the substrate supporting region 101*a* to surround the substrate supporting region 101*a* in plan view.

The insulating annular member (insulator ring) 102 is disposed around the base 100 and the ceramic plate 101 to surround the base 100 and the ceramic plate 101 in plan view. The insulating annular member 102 is made of an insulator such as ceramic, quartz, or the like.

The fixed edge ring 110 is disposed around the substrate W supported by the ceramic plate 101 to surround the substrate W in plan view. The fixed edge ring 110 has an inner peripheral portion (inner portion) 110*a* and an outer peripheral portion (outer portion) 110*b*. The inner peripheral portion 110*a* is supported on the ring supporting region 101*b* of the ceramic plate 101, and the outer peripheral portion 110*b* is supported on the insulating annular member 102. The fixed edge ring 110 is provided to improve uniformity of plasma processing, for example. The fixed edge ring 110 is made of a plasma resistant, material, because it is exposed to plasma during plasma processing. In one embodiment, the fixed edge ring 110 is made of an insulating material. In one embodiment, the insulating material is quartz. The outer peripheral portion 110*b* of the fixed edge ring 110 has a width (first width) W.

The movable edge ring 120 is supported by lifter pins 121 extending downward from the movable edge ring 120. The movable edge ring 120 is disposed above the outer peripheral portion 110*b* of the fixed edge ring 110, i.e., above the insulating annular member 102. The lifter pins 121 penetrate through the fixed edge ring 110 and the insulating annular member 102. The movable edge ring 120 and the lifter pin 121 are vertically moved by the moving mechanism 122. The movable edge ring 120 and the lifter pin 121 are made of a plasma resistant material because they are exposed to plasma during plasma processing. In one embodiment, they are made of an insulating material. In one embodiment, the insulating material is quartz. The moving mechanism 122 is not particularly limited, and may be an actuator.

<Support Structure for Movable Edge Ring>

Figure 5:
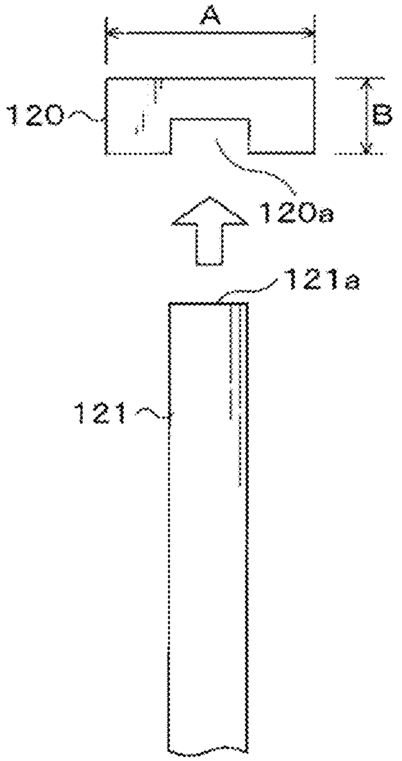
FIG. 5 illustrates a support structure of a movable edge ring.

As shown in FIG. 5, a recess 120*a* is formed on the bottom surface of the movable edge ring 120. The upper surface 121*a* of the lifter pin 121 is flat and is inserted into the recess 120*a* to support the movable edge ring 120. In other words, the lifter pin 121 is inserted into the recess 120*a* to support the movable edge ring 120 on the upper surface 121*a* thereof. A width (second width) A of the movable edge ring 120 is smaller than the width W of the outer peripheral portion 110*b* of the fixed edge ring 110. The width A of the movable edge ring 120 is, e.g., 20 mm to 40 mm. In the case of reducing the width A of the movable edge ring 120 to reduce the area exposed to the plasma, the influence on the plasma processing can be suppressed. A thickness B of the movable edge ring 120 is, e.g., 2 mm to 10 mm. The thickness B is more preferably 4 mm or more in order to suppress the consumption of the movable edge ring 120.

In the present embodiment, the support structure for the movable edge ring 120 and the lifter pin 121 is simple, and the friction with the fixed edge ring 110 can be reduced, which makes it possible to suppress generation of dust due to the friction.

<Planar Position of Movable Edge Ring>

Here, as shown in FIG. 4, an RF path through which the RF current passes ("RF Pass" arrow in FIG. 4) includes a path between the outer surface of the base 100 and the inner surface of the insulating annular member 102, a path between the upper surface of the base 100 and the bottom surface of the ceramic plate 101, and a path directed upward from the upper surface of the base 100 through the fixed edge ring 110. For example, when the movable edge ring and the lifter pin are vertically moved at a radially inner side of the RF path, ER and CD may vary at the central portion of the substrate W. ER indicates an etching rate in the case where the plasma processing is etching. CD indicates a critical dimension of a pattern of the substrate W. Further, when the movable edge ring and lifter pin are vertically moved at the radially inner side of the RF path, abnormal discharge may occur due to the vertical movement near the RF path.

Therefore, in the present embodiment, the movable edge ring 120 and the lifter pin 121 are disposed at the radially outer side of the RF path, so that the vertical movement is not performed near the RF path. Therefore, the variation in ER and CD can be suppressed, and abnormal discharge can be further suppressed. Further, by separating the movable edge ring 120 and the lifter pin 121 from the substrate W, it is possible to reliably suppress adhesion of particles to the substrate W even in the case where dust is generated due to the vertical movement.

An inner diameter of the movable edge ring 120 is, e.g., 340 mm to 370 mm, and an outer diameter thereof is, e.g., 380 mm to 410 mm.

<Vertical Movement Amount of Movable Edge Ring>

Figure 6:
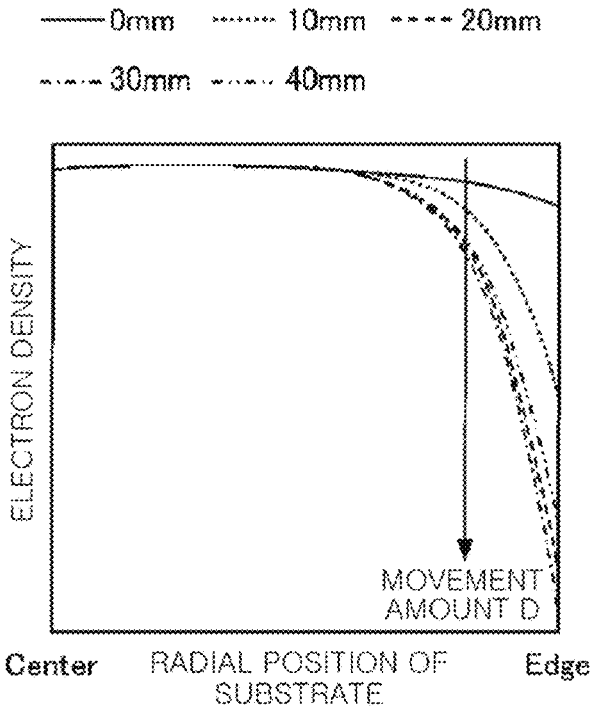
FIG. 6 is a graph showing a relationship between the amount of movement of the movable edge ring and an electron density.

A movement amount (displacement) D of the movable edge ring 120 by the moving mechanism 122 is, e.g., 0 mm to 40 mm. The movement amount D of the movable edge ring 120 can be increased because the support structure for the movable edge ring 120 and the lifter pin 121 is simple and the movable edge ring 120 is disposed at the radially outer side as described above. When the movement amount D is 0 mm, the movable edge ring 120 is placed on the upper surface of the fixed edge ring 110 as indicated by dotted lines in FIG. 4. The inventors have performed a simulation for obtaining electron density (plasma) distribution in a radial direction of the substrate W while varying the movement amount D (height position of the movable edge ring 120) of the movable edge ring 120. FIG. 6 shows simulation results. In FIG. 6, the horizontal axis represents a radial position of the substrate W, and the vertical axis represents an electron density. In this simulation, the movement amount D of the movable edge ring 120 was set to 0 mm, 10 mm, 20 mm, 30 mm, and 40 mm, and the electron density distribution at each movement amount D was measured. Referring to FIG. 6, the electron density at the edge portion of the substrate W decreases as the movement amount D of the movable edge ring 120 increases. In other words, by controlling the movement amount D of the movable edge ring 120, the electron density only at the edge portion of the substrate W can be controlled, and the CD of the edge portion of the substrate W can be further controlled.

In accordance with the substrate support 11 of the present embodiment, the movable edge ring 120 can function as a plasma distribution control knob. As described above, conventionally, plasma processing conditions and the like were controlled in order to control the plasma distribution (difference in plasma between the center and the edge of the substrate W). However, in the case of adjusting the plasma processing conditions, the restriction in the plasma processing increases and, thus, a degree of freedom decrease. Therefore, in the present embodiment, the movable edge ring 120 can function as the plasma distribution control knob, so that it is possible to perform plasma processing uniformly on the substrate surface and also possible to increase the degree of freedom of plasma processing conditions.

Although it is not illustrated, the substrate support 11 may include a temperature control module configured to adjust at least one of the ceramic plate 101, the insulating annular member 102, the fixed edge ring 110, the movable edge ring 120, or the substrate W to a target temperature. The temperature control module may include a heater, a heat transfer medium, or a combination thereof, in addition to the flow path 103. Further, the substrate support 11 may include a heat transfer gas supply configured to supply a heat transfer gas to a space between the backside of the substrate W and the substrate supporting region 101*a*.

<Plasma Etching Method>

Next, a plasma processing method (plasma etching method) using the plasma processing system configured as described above will be described. In the present embodiment, a case where the substrate W is subjected to etching, e.g., so-called silicon etching, will be described.

First, in the plasma processing apparatus 1, the substrate W is loaded into the plasma processing chamber 10. The substrate W is placed on the ceramic plate 101 of the substrate support 11 and attracted and held by the electrostatic force. Then, the exhaust, system 50 is used to reduce a pressure in the plasma processing space 10*s* to a desired pressure.

Next, the gas supply 30 supplies the processing gas into the plasma processing space 10*s*, and the microwave supply 20 irradiates microwaves into the plasma processing space 10*s*. Plasma is generated from the processing gas in the plasma processing space 10*s* by the microwaves. In this case, the movable edge ring 120 and the lifter pin 121 are vertically moved by the moving mechanism 122, and the movement, amount D thereof is controlled to control the electron density (plasma) at the edge portion of the substrate W. As a result, the plasma distribution on the substrate W can be controlled to be uniform.

In the case of generating plasma, the power supply 40 supplies the bias RF power to the conductive member of the base 300. Accordingly, a bias potential is generated at the substrate W, and ions in the plasma are attracted to the substrate W. Then, the substrate W is exposed to the plasma, and silicon of the substrate W is etched.

When the substrate W is etched in a desired shape, the supply of the processing gas, the irradiation of the microwaves, and the supply of the bias RF power are stopped. Then, the substrate W is unleaded from the plasma processing chamber 10, and a series of plasma processing is completed.

When the plasma processing is repeatedly performed on a plurality of substrates W, the fixed edge ring 110 is consumed and the thickness of the fixed edge ring 110 is reduced. Therefore, a sheath shape changes above the fixed edge ring 110 and the edge portion of the substrate W. Therefore, in the case of generating plasma from the processing gas in the plasma processing space 10*s*, the movement amount D of the movable edge ring 120 is adjusted. Accordingly, the electron density (plasma) at the edge portion of the substrate W is controlled, and the plasma distribution on the substrate W can be controlled to be uniform. Hence, the controller 2 is configured to control the plasma processing apparatus 1 to perform first to fifth steps. In the first step, the substrate W is disposed on the substrate supporting region (central region) 101*a* of the substrate support 11. In one embodiment, the substrate W includes a silicon layer. In the second step, the processing gas is supplied to the plasma processing chamber 10. In the third step, plasma is generated from the processing gas supplied into the plasma processing chamber 10. In the fourth step, the substrate W on the substrate support 11 is exposed to the plasma, so that the silicon layer on the substrate W is etched. In the fifth step, the movable edge ring 120 is vertically moved by the lifter pins 121. The fifth step may be performed while plasma is being generated in the plasma processing chamber 10, i.e., while the silicon layer on the substrate W is being etched, or may be performed before plasma is generated in the plasma processing chamber 10. Further, the fifth step may be performed before the first step.

It should be noted that the above-described embodiments are illustrative in all respects and are not restrictive. The above-described embodiments may be omitted, replaced, or changed in various forms without departing from the scope, of the appended claims and the gist thereof. For example, the above embodiment has described the case of etching the silicon layer of the substrate W. However, the present disclosure is not limited thereto, and may be applied to a case of etching a silicon oxide layer. In this case, the fixed edge ring 110 and the movable edge ring 120 may be made of Si or SiC material.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate support for use in a plasma processing apparatus, the substrate support comprising:
- a substrate support member;
- a base;
- a ceramic plate disposed on the base, the ceramic plate having a substrate supporting region and a ring supporting region surrounding the substrate supporting region;
- an insulating annular member disposed around the base and the ceramic plate;
- a fixed edge ring having an inner peripheral portion and an outer peripheral portion, the inner peripheral portion being supported on the ring supporting region, the outer peripheral portion being supported on the insulating annular member, the outer peripheral portion having a first width;
- a movable edge ring disposed on or above the outer peripheral portion of the fixed edge ring, the movable edge ring having a second width smaller than the first width;
- a lifter pin extending through the fixed edge ring, extending through the insulating annular member and contacting the movable edge ring to move the movable edge ring; and
- an actuator configured to vertically move the lifter pin to move the movable edge ring with respect to the fixed edge ring,
- wherein the fixed edge ring is disposed on the insulating annular member and the fixed edge ring is disposed on the ceramic plate,
- wherein the insulating annular member and the base are disposed directly on the substrate support member,
- wherein the substrate support member is disposed at a bottom of a chamber of the plasma processing apparatus,
- wherein an entirety of the fixed edge ring is disposed below the movable edge ring in a vertical direction,
- wherein most of the outer peripheral portion of the fixed edge ring is not covered by the movable edge ring,
- wherein the movable edge ring and the lifter pin are disposed radially outside of an RF path through which RF current passes, and
- wherein the fixed edge ring is disposed above the insulating annular member in the vertical direction.

2. The substrate support of claim 1, wherein a displacement of the movable edge ring by the actuator is in a range of 0 mm to 40 mm.

3. The substrate support of claim 1, wherein the second width is in a range of 20 mm to 40 mm.

4. The substrate support of claim 1, wherein the movable edge ring has a thickness in a range of 2 mm to 10 mm.

5. The substrate support of claim 1, wherein each of the fixed edge ring and the movable edge ring is made of quartz.

6. The substrate support of claim 5,
- wherein the lifter pin is made of quartz.

7. The substrate support of claim 6, wherein the movable edge ring has a recess on a bottom surface of the movable edge ring, and
- the lifter pin is inserted into the recess to support the movable edge ring by an upper surface of the lifter pin.

8. The substrate support of claim 7, wherein the upper surface of the lifter pin is flat.

9. The substrate support of claim 1, wherein the movable edge ring overlaps the insulating annular member in the vertical direction.

10. The substrate support of claim 9, wherein:
- the second width of the movable edge ring is an entire extension of the movable edge ring in a radial direction, wherein the radial direction is transverse to the vertical direction,
- the first width of the fixed edge ring extends from a first circumferential surface of the fixed edge ring to a second circumferential surface of the fixed edge ring, and
- the movable edge ring being disposed between the first circumferential surface of the fixed edge ring and the second circumferential surface of the fixed edge ring.

11. The substrate support of claim 1, wherein the fixed edge ring remains fixed relative to the ceramic plate.

12. A plasma processing system comprising:
- a plasma processing apparatus; and
- a controller,
- wherein the plasma processing apparatus includes:
  - a plasma processing chamber;
  - a substrate support disposed in the plasma processing chamber;
  - a gas supply configured to supply a processing gas to the plasma processing chamber; and
  - a plasma generator configured to generate a plasma from the processing gas,
- wherein the substrate support includes:
  - a substrate support member;
  - a base;
  - a ceramic plate disposed on the base and having a substrate supporting region and a ring supporting region surrounding the substrate supporting region;
  - an insulating annular member disposed around the base and the ceramic plate;
  - a fixed edge ring having an inner peripheral portion and an outer peripheral portion, the inner peripheral portion being supported on the ring supporting region, the outer peripheral portion being supported on the insulating annular member, the outer peripheral portion having a first width;
  - a movable edge ring disposed on or above the outer peripheral portion of the fixed edge ring and having a second width smaller than the first width;
  - a lifter pin extending through the fixed edge ring, extending through the insulating annular member and contacting the movable edge ring to move the movable edge ring; and
  - an actuator configured to vertically move the lifter pin to move the movable edge ring with respect to the fixed edge ring by the lifter pin,
- wherein the fixed edge ring is disposed on the insulating annular member and the fixed edge ring is disposed on the ceramic plate,
- wherein the insulating annular member and the base are disposed directly on the substrate support member,
- wherein the substrate support member is disposed at a bottom of a chamber of the plasma processing apparatus,
- wherein each of the fixed edge ring, the movable edge ring and the lifter pin is made of an insulating material,
- wherein an entirety of the fixed edge ring is disposed below the movable edge ring in a vertical direction,
- wherein most of the outer peripheral portion of the fixed edge ring is not covered by the movable edge ring,
- wherein the movable edge ring and the lifter pin are disposed radially outside of an RF path through which RF current passes, and
- wherein the fixed edge ring is disposed above the insulating annular member in the vertical direction, and wherein the controller is configured to control the plasma processing apparatus to perform:

supplying the processing gas to the plasma processing chamber;

generating the plasma from the processing gas;

etching a substrate; and vertically moving the movable edge ring by the lifter pin.

13. The plasma processing system of claim 12, wherein the movable edge ring overlaps the insulating annular member in the vertical direction.

14. The plasma processing system of claim 13, wherein:

the second width of the movable edge ring is an entire extension of the movable edge ring in a radial direction, wherein the radial direction is transverse to the vertical direction, the first width of the fixed edge ring extends from a first circumferential surface of the fixed edge ring to a second circumferential surface of the fixed edge ring, and the movable edge ring being disposed between the first circumferential surface of the fixed edge ring and the second circumferential surface of the fixed edge ring.

15. The plasma processing system of claim 12, wherein during the vertically moving of the movable edge ring by the lifter pin, the fixed edge ring remains fixed relative to the ceramic plate.

16. The plasma processing system of claim 12, wherein the controller is configured to control the actuator to adjust a movement amount of the movable edge ring to control an electron density at an edge portion of the substrate.

* * * * *